United States Patent [19]

Bakhoum

[11] Patent Number: 5,218,306
[45] Date of Patent: * Jun. 8, 1993

[54] STATIC CHARGE WARNING DEVICE

[76] Inventor: Ezzat G. Bakhoum, 613 Clarion Dr., Durham, N.C. 27705

[ * ] Notice: The portion of the term of this patent subsequent to Nov. 17, 2009 has been disclaimed.

[21] Appl. No.: 950,642

[22] Filed: Sep. 23, 1992

Related U.S. Application Data

[63] Continuation of Ser. No. 823,287, Jan. 22, 1992, Pat. No. 5,164,674.

[51] Int. Cl.⁵ .................. G01R 31/14; G01R 31/02; G08B 21/00
[52] U.S. Cl. .................. 324/509; 324/72.5; 361/212; 340/649
[58] Field of Search .................. 324/72.5, 713, 457, 324/509; 361/212, 220; 340/649; 307/542, 491

[56] References Cited

U.S. PATENT DOCUMENTS 5,164,674 11/1992 Bakhoum .................. 324/509

Primary Examiner—Kenneth A. Wieder
Assistant Examiner—Maura K. Regan

[57] ABSTRACT

A wrist-worn static charge warning device constructed and arranged to remain silent most of the time. The device emits an audible signal in the event that the charged individual wearing the device is approaching a grounded or poorly grounded electronic circuit, thereby warning against possible damage to the circuit before the occurrence of such damage.

The invention is based on the fundamental concept that movements of static charges can be detected by means of two RC circuits connected in a Master-Slave configuration.

25 Claims, 3 Drawing Sheets

STATIC CHARGE WARNING DEVICE

CROSS-REFERENCE TO RELATED APPLICATION

This is a continuation of U.S. application Ser. No. 07/823,287 filed Jan. 22, 1992 now U.S. Pat. No. 5,164,674 in the name of Ezzat G. Bakhoum for "A Static Charge Warning Device".

BACKGROUND OF THE INVENTION

1. Field of the Invention

This invention relates to a device for warning against possible occurrence of ESD (electrostatic discharge), and particularly a device of such type which may be worn on the wrist in a compact form.

2. Description of the Related Art

While the present invention is broadly useful for warning against possible occurrence of ESD from a charged body, the application of particular concern is the warning against possible damage to sensitive electronic devices due to the presence of static charges on the human body.

In the electronic industry, static electricity currently accounts for as much as $ 2 billion in damages to sensitive MOS devices each year. Most of these damages occur when MOS chips are touched by ungrounded personnel, due to the flow of static charges from the body to ground, through the circuits of the chip.

No device is currently available for warning against possible damage to sensitive MOS devices at the instant such damage is about to occur. It is the object of the present invention to provide such a device of compact and efficient character.

Apart from corporeal applications, a number of systems have been devised in the art to preclude static electricity build-up.

U.S. Pat. No. 3,634,726 issued Jan. 11, 1972 to Pierre Jay describes an apparatus for removing static electricity from plastic films.

U.S. Pat. No. 4,523,252 issued Jun. 11, 1985 to J. O. Wallen describes a device for eliminating static electricity on machines and charged materials.

U.S. Pat. No. 4,180,698 issued Dec. 25, 1979 to R. B. Carpenter describes a system for protection of objects located on the surface of the earth from the effects of atmospherics.

U.S. Pat. No. 4,766,903 issued Aug. 30, 1988 to Herbert Esper describes a device for detecting and removing static charges from the human body. The device, however, requires a ground connection.

U.S. Pat. No. 4,849,851 issued Jul. 18, 1989 to R. J. Cubbison, Jr. describes a static electric discharge device which may be contained in a wrist-mountable unit. The device is based on a concept that the electric field of the body can attract opposite charges from a layer of ionized air. The Cubbison, Jr. patent suffers various deficiencies in use, and will not achieve its intended purpose of effectively removing charges from the body, mainly due to the fact that the electric field at any particular point on the skin is negligibly small, since the charge is distributed all over the body.

The object of the present invention is to provide a device for producing an audible signal in the event that a charged person approaches a grounded or poorly grounded electronic device, thus warning against possible chip damage before the occurrence of such damage.

SUMMARY OF THE INVENTION

In one aspect, the present invention relates to a device for warning against possible damage to sensitive electronic devices due to the presence of static charges on the human body, comprising, in circuit relationship:
   a needle electrode having one terminal;
   a conductive body contact means for establishing electrical contact with the body, and connected to the terminal of the needle electrode;
   a sensing electrode having one terminal, and placed in close proximity to the needle electrode;
   two RC circuits in a Master-Slave configuration, with the master circuit being connected to the terminal of the sensing electrode;
   a differential amplifier for detecting voltage difference between the two RC circuits and for producing an output indicative of such voltage difference;
   an edge-triggered monostable circuit having input and output terminals, with the input terminals being connected to the output of the differential amplifier;
   a DC buzzer, or other warning system, connected to the output of the monostable circuit.

In a further aspect, the warning device described above is encased in a unitary housing having an external connector for grounding the individual wearing the device, in case a ground connection is available.

Other aspects and features of the invention will be more fully apparent from the ensuing disclosure and appended claims.

DETAILED DESCRIPTION OF THE INVENTION, AND PREFERRED EMBODIMENTS THEREOF

The present invention is based on the fundamental concept that movements of static charges can be detected by means of two RC circuits connected in a Master-Slave configuration.

When a human body is electrically charged by friction or other means, the charge is distributed all over the body. Since the mobility of charges inside the human body is high, charges flow easily from one part of the body to the other under the influence of external sources of attraction. For instance, when the fingers of a charged person approach a ground point, most of the charge on the body flow rapidly to the fingers due to an induction process that occurs instantaneously.

The present invention uses this principle to concentrate the body's charge on a needle electrode connected to the wrist of the charged individual. As the fingers (or other part of the body) approach a grounded or poorly grounded electronic circuit, the flow of charges from the wrist to the fingers decreases the charge concentration on the needle. This sudden movement of charges can be detected as a fluctuation in voltage between two RC circuits connected in a Master-Slave configuration.

Figure 1:
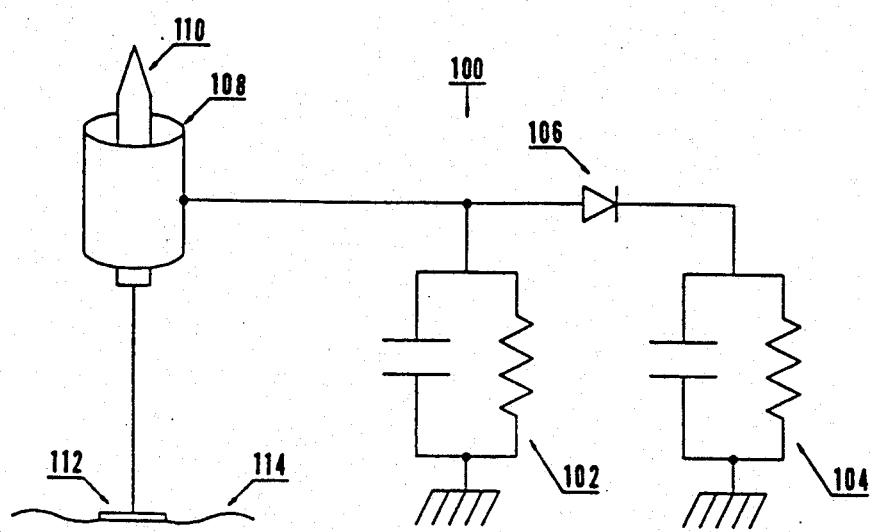
FIG. 1 is a schematic representation illustrating the general concept of the detection of static charge movements by means of two RC circuits in a Master-Slave configuration.

FIG. 1 illustrates the basic concept underlying the present invention. This figure shows a static charge warning device 100 comprising two RC circuits 102 and 104 in a Master-Slave configuration, with the master 102 being connected to a sensing electrode 108, and with the slave 104 being isolated from the master by a diode 106. The sensor is placed in close proximity to a needle electrode 110 which is in contact with a body contact member 112. The body contact member, in turn, is in skin contact with the body 114.

The time constant of the slave circuit is made much longer than that of the master (the time constant of the master RC is suitably in the range of 0.1-1 seconds, while that of the slave RC is suitably in the range of 2-10 seconds). If the voltage on the master is maintained fixed (or is decreasing slowly) due to the presence of static charges on the needle, then the voltage difference $V_{master}-V_{slave}$ is precisely 0.6 volts. If such voltage difference is then fed to a differential amplifier (not shown in FIG. 1), the output of the amplifier will be constant.

When the person wearing the device approaches a ground point, some charges will flow from the needle to the fingers, as explained previously. Due to the large difference in the time constant, the voltage on the master 102 drops abruptly, while the voltage on the slave 104 decreases more slowly. The isolation diode 106 then becomes instantaneously reverse-biased.

Typically, such voltage drop on the master is in the order of 0.1 volts. The instantaneous voltage difference fed to the amplifier then becomes 0.5 volts instead of 0.6 volts. Such fractional voltage difference at the inputs of the amplifier will result in a large voltage drop at the amplifier's output.

It will be apparent from the foregoing that the slave RC circuit functions as an "instantaneous analog memory" to provide a reference voltage for comparison when the potential on the master RC drops abruptly.

Figure 2:
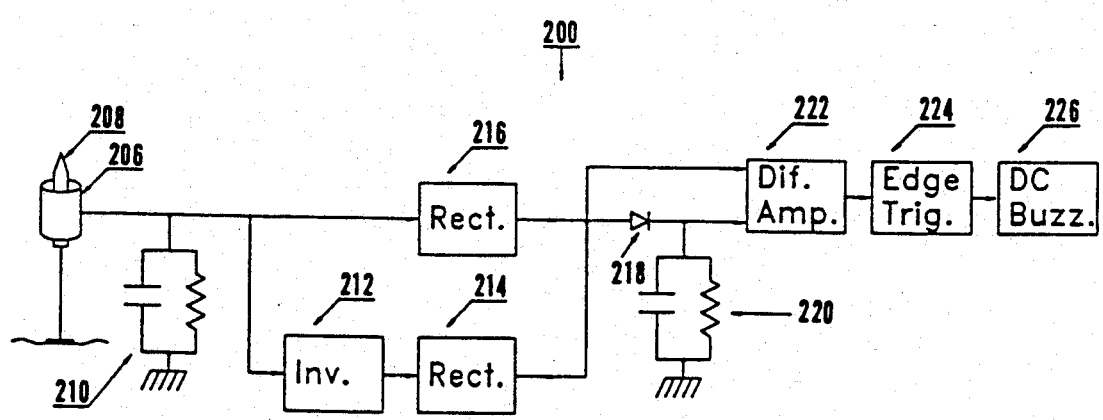
FIG. 2 is a schematic representation illustrating the basic building blocks of the present invention.

FIG. 2 shows the basic building blocks of the present invention. The invention allows for detection of either positive or negative charges on the body. This is accomplished by means of two half-wave rectifiers 214 and 216, and an inverter 212. For a negative potential on the master RC circuit 210, the output of the inverter 212 is positive, and hence the output of the rectifier 214 is positive, while the output of rectifier 216 is grounded; and vice versa. (Alternatively, full rectification can be achieved by means of four half-wave rectifiers arranged in a bridge configuration). All circuits used for rectification, inversion and amplification use OPAmps (Operational Amplifiers) with dual voltage supplies and JFET inputs, to provide high input impedance.

In principle, the circuit can operate without the sensing electrode 206 and could be connected directly to the needle 208; however, the presence of the sensing electrode is essential to avoid damage to the sensitive JFET inputs of the OPAmps.

The slave RC circuit 220 is isolated by diode 218, and the voltage difference is fed to a difference amplifier 222. The output of the amplifier then triggers an edge-triggered monostable circuit 224. The monostable circuit suitably includes an IC555 timing device. The output of the monostable circuit, in turn, activates a DC buzzer 226.

Figure 3:
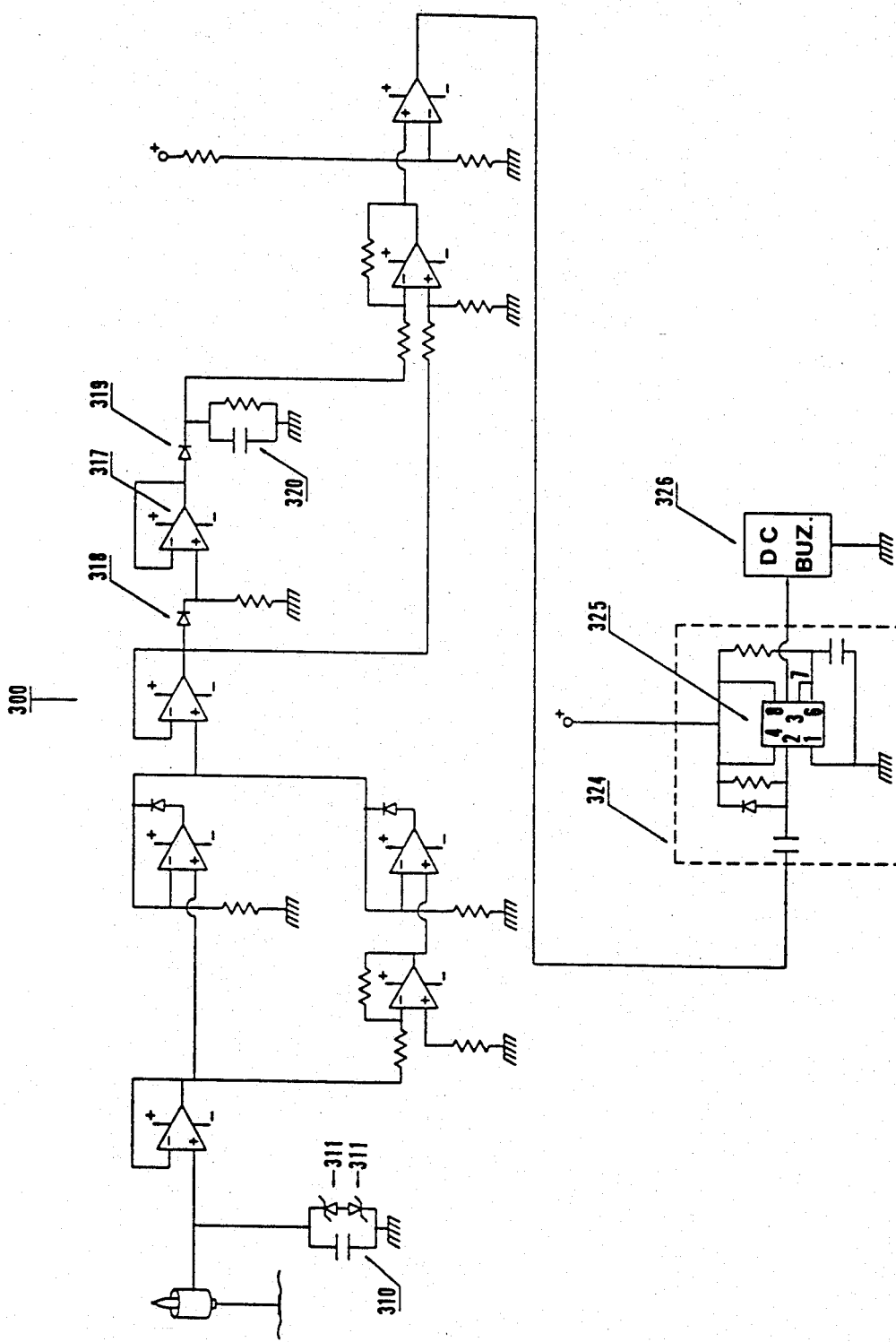
FIG. 3 is a schematic representation of a complete device for producing a warning signal in the event that a charged individual approaches a grounded or poorly grounded electronic device.

FIG. 3 shows a complete schematic of a working device 300 for warning against possible damage to sensitive electronic devices due to the presence of static charges on the human body. In the master RC circuit 310, the resistor is replaced by two zener diodes mounted back-to-back (311), to limit the voltage input below the saturation voltage of the OPAmps. The isolation diode is shown as the component 318 in FIG. 3. The diode is followed by a buffer 317. Since buffers can source or sink current, a second diode 319 is necessary before the buffer's output is fed to the slave RC circuit 320. The diode 319, however, is always operating near the cutoff voltage (zero), and hence contributes a negligible voltage drop.

The edge-triggered monostable circuit 324 is of a known type. It uses an IC555 timing device (325), and is described more fully in "IC555 Projects", by E. A. Parr, Babani publishing, U.K., 1981, p. 15. The purpose of the edge-triggered monostable is to feed the DC buzzer 326 with a pulse of small duration (this duration is suitably 1 second).

While the devices of FIGS. 1, 2 and 3 have been illustratively described hereinabove with reference to specific voltage and time constant values, as well as specific components; as for example the use of OPAmps with JFET inputs for amplification, rectification, buffering, etc.; it will be recognized that the device may be variously configured, utilizing other parametric values of voltage and time constant, as well as other components; as for example transistors instead of OPAmps, etc.; within the skill of the art.

Figure 4:
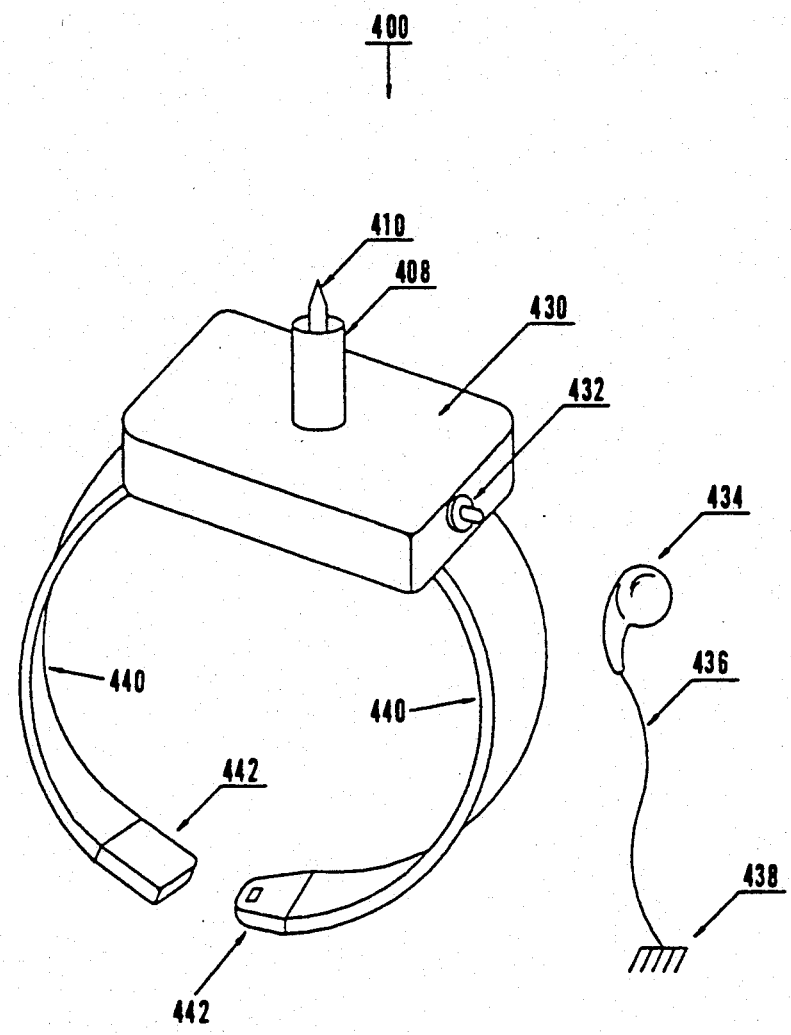
FIG. 4 is a perspective view of a wrist-mountable static charge warning device, according to one embodiment of the invention.

FIG. 4 is a perspective view of a wrist-mountable device in accordance with the present invention. As shown, the wrist-mountable device 400 includes a plastic housing 430 for housing the electronic components and the batteries used in the circuit. The housing 430 is configured with an opening from which the needle electrode 410 and the sensing electrode 408 emerge, thereby exposing the needle electrode to free air. The purpose of exposing the needle to free air is to allow some of the charge on the body to discharge through the needle by the Corona effect, thereby preventing any direct discharge between the needle and the sensing electrode 408; since such discharge may damage the sensitive JFET inputs of the circuit.

The housing 430 is further configured with a fixed male connector 432, and a removable female connector 434, thereby providing means for connecting the wearer of the device to an earthing point 438 through wire 436, in case such earthing point is available. (The earthing point 438 should not be confused with the ground system of the circuit in FIG. 3, as the circuit in FIG. 3 is a stand-alone circuit and does not require any connections to earth).

The male connector 432 and the needle 410 are connected to a body contact member, similar to the member 112 in FIG. 1. This unitary enclosure is joined to respective wrist-strap segments 440, having free ends featuring clasp elements 442.

It will be apparent from the foregoing that the static charge warning device of the present invention is a device that remains silent most of the time, thus minimizing noise in the work environment. The device of the invention emits an audible signal in the event that the individual wearing the device is charged and is approaching a grounded or poorly grounded electronic circuit, thus warning against possible damage to the circuit before the occurrence of such damage.

It will be recognized, however, that the warning system may consist of LEDs (light-emitting diodes), or other warning devices providing a sensory (audio, visual and/or tactile) output, instead of a DC buzzer. Further, while the invention has been shown in a particular embodiment as a wrist-mountable structure, it will be appreciated that the device may be configured in any suitable manner, to be mountable on or coupleable with any other part of the body. Moreover, it will be recognized that the device is useful for the detection of movements of electrostatic charges on any conductive or semiconductive body in general.

Finally, while the invention has been described with reference to specific aspects, features, and embodiments, it will be appreciated that various modifications, alternatives, and other embodiments are possible within the broad scope of the invention, and the invention therefore is intended to encompass all such modifications, alternatives, and other embodiments, within its scope.

What is claimed is:

1. A device for sensing the movements of electrostatic charges on a conductive or semi-conductive body, comprising:
   means for sensing the electric field of the body;
   two RC circuits in a master-slave configuration, with the master circuit being connected to the sensing means of the device;
   means for detecting voltage difference between the two RC circuits and for producing an output indicative of such voltage difference.

2. A device according to claim 1, wherein the slave RC circuit is isolated from the master RC circuit by at least one diode.

3. A device according to claim 1, wherein the time constant of the master RC circuit is in the range of 0.1 seconds to 1 second.

4. A device according to claim 1, wherein the time constant of the slave RC circuit is in the range of 2 seconds to 10 seconds.

5. A device according to claim 1, wherein the voltage of the master RC circuit is fully rectified by means of two half-wave rectifier circuits and an inverter circuit.

6. A device according to claim 1, wherein the voltage of the master RC circuit is fully rectified by means of four half-wave rectifier circuits arranged in a bridge configuration.

7. A device according to claim 5, wherein the inverter and rectifier circuits use OPAmps with JFET inputs and dual supply voltages.

8. A device according to claim 1, wherein the voltage detection means comprises a differential amplifier.

9. A device according to claim 8, wherein the differential amplifier comprises an OPAmp.

10. A device according to claim 1, wherein the voltage detection means comprises and edge-triggered monostable circuit.

11. A device according to claim 10, wherein the edge-triggered monostable circuit uses an IC555 timing device.

12. A device according to claim 1, wherein the voltage detection means comprises a warning system.

13. A device according to claim 12, wherein the warning system is a DC buzzer.

14. A device according to claim 12, wherein the warning system is a light-emitting diode.

15. A device according to claim 1, wherein the master RC circuit comprises two Zener diodes to avoid saturation of the OPAmps.

16. A device according to claim 1, wherein the means for sensing the electric field comprises a needle electrode.

17. A device according to claim 1, wherein the means for sensing the electric field further comprises a metallic electrode placed in close proximity to the needle electrode.

18. A device according to claim 17, disposed in a unitary housing having an opening to allow for the exposure of the needle and metallic electrodes to free air.

19. A device according to claim 1, constructed and arranged for mounting on the human body.

20. A device according to claim 18, wherein the unitary housing comprises an external connector as an option for grounding the wearer of the device.

21. A device according to claim 19, wherein the device is constructed and arranged to remain silent if the charged wearer is at least 1.5 inches far away from a grounded or poorly grounded electronic circuit.

22. A device according to claim 19, wherein the device produces a warning signal if the charged wearer is at a distance of less than 1.5 inches away from a grounded or poorly grounded electronic circuit, thereby warning against possible damage to the circuit before the occurrence of such damage.

23. A device according to claim 19, wherein the warning signal is produced as a result of abrupt change of voltage difference on the master-slave RC combination.

24. A device according to claim 23, wherein the abrupt change of voltage on the Master-Slave RC combination results from the flow of charges from the needle electrode to the part of the body that is close to touching the grounded or poorly grounded circuit.

25. A device according to claim 19, configured as a wrist-mountable unit.

* * * * *